United States Patent
Jeong

(10) Patent No.: US 9,142,265 B2
(45) Date of Patent: Sep. 22, 2015

(54) SEMICONDUCTOR MEMORY DEVICE

(71) Applicant: SAMSUNG ELECTRONICS CO., LTD., Suwon-si, Gyeonggi-do (KR)

(72) Inventor: In-chul Jeong, Suwon (KR)

(73) Assignee: SAMSUNG ELECTRONICS CO., LTD., Suwon-si, Gyeonggi-do (KR)

( * ) Notice: Subject to any disclaimer, the term of this patent is extended or adjusted under 35 U.S.C. 154(b) by 189 days.

(21) Appl. No.: 13/899,949

(22) Filed: May 22, 2013

(65) Prior Publication Data

US 2014/0016420 A1 Jan. 16, 2014

(30) Foreign Application Priority Data

Jul. 10, 2012 (KR) .................. 10-2012-0075173

(51) Int. Cl.
*G11C 7/06* (2006.01)
*G11C 7/18* (2006.01)
*G11C 5/02* (2006.01)

(52) U.S. Cl.
CPC .. *G11C 7/06* (2013.01); *G11C 7/18* (2013.01); *G11C 5/025* (2013.01)

(58) Field of Classification Search
CPC ............ H01L 27/0617; H01L 27/0705; H01L 2227/00; G11C 7/06; G11C 5/025
See application file for complete search history.

(56) References Cited

U.S. PATENT DOCUMENTS

| | | | |
|---|---|---|---|
| 5,930,163 A | 7/1999 | Hara et al. | |
| 6,201,749 B1 * | 3/2001 | Fujita | 365/203 |
| 6,418,073 B1 * | 7/2002 | Fujita | 365/203 |
| 6,510,094 B2 * | 1/2003 | Chung et al. | 365/222 |
| 6,649,984 B1 * | 11/2003 | Noda et al. | 257/392 |
| 7,030,437 B2 | 4/2006 | Yodogawa et al. | |
| 7,639,556 B2 * | 12/2009 | Yang et al. | 365/207 |
| 7,675,785 B2 | 3/2010 | Takahashi | |
| 2005/0237778 A1 | 10/2005 | Kitsukawa et al. | |
| 2007/0278554 A1 * | 12/2007 | Song et al. | 257/314 |
| 2010/0078699 A1 | 4/2010 | Nakano | |
| 2014/0246725 A1 * | 9/2014 | Lee et al. | 257/368 |

FOREIGN PATENT DOCUMENTS

| | | |
|---|---|---|
| JP | 10-084087 A | 3/1998 |
| JP | 11-068065 A | 3/1999 |
| KR | 10-0866131 B1 | 10/2008 |

* cited by examiner

*Primary Examiner* — Allison P Bernstein
(74) *Attorney, Agent, or Firm* — Lee & Morse, P.C.

(57) ABSTRACT

A semiconductor memory device includes a sense amplifier circuit region including first wells disposed in a first direction, a driving circuit region including second wells disposed in a second direction, and a conjunction region disposed at an intersection region of the sense amplifier circuit region and the driving circuit region, a part of each of the first wells extending from the sense amplifier circuit region into the conjunction region, and the second wells being outside of the conjunction region.

20 Claims, 12 Drawing Sheets

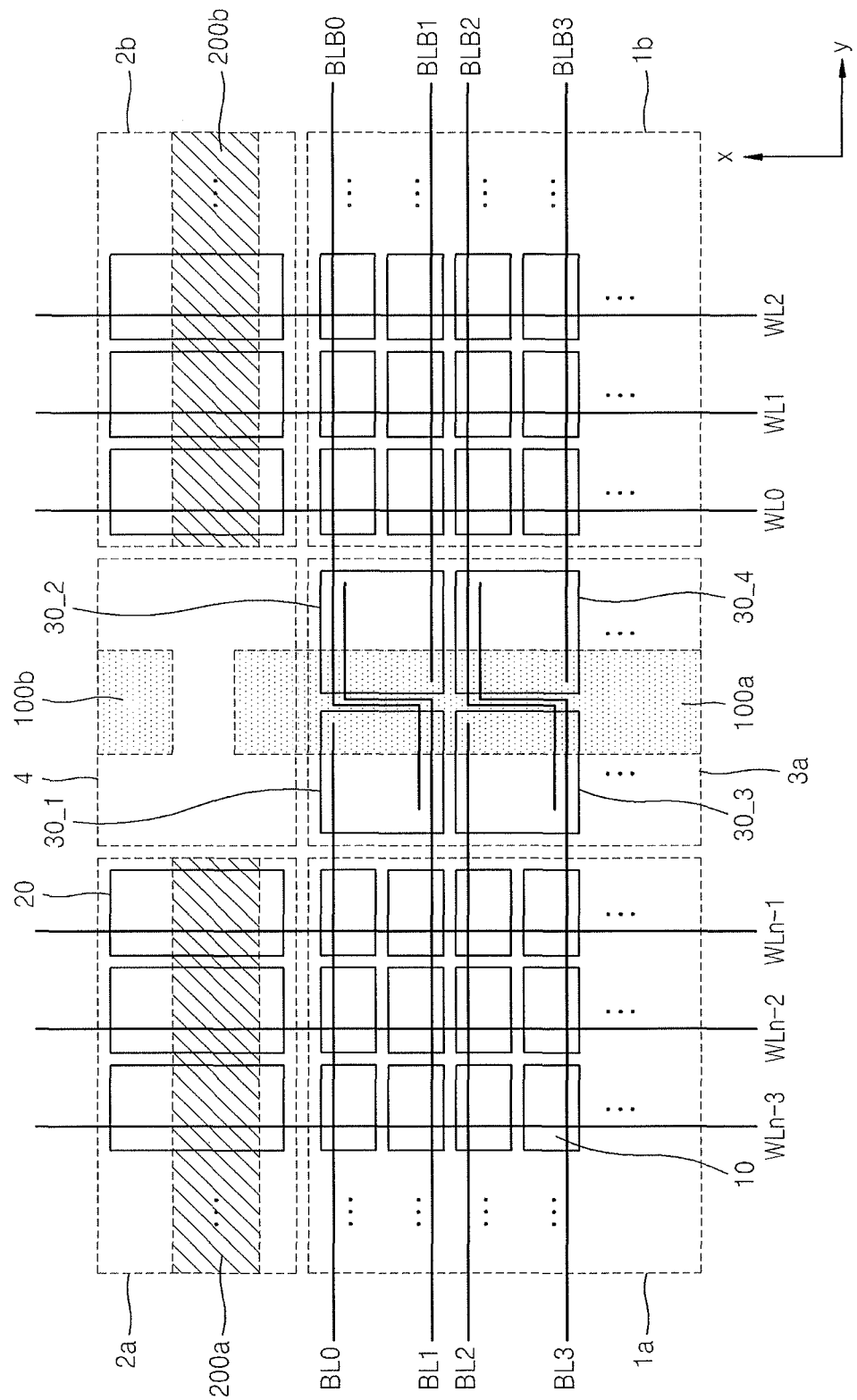

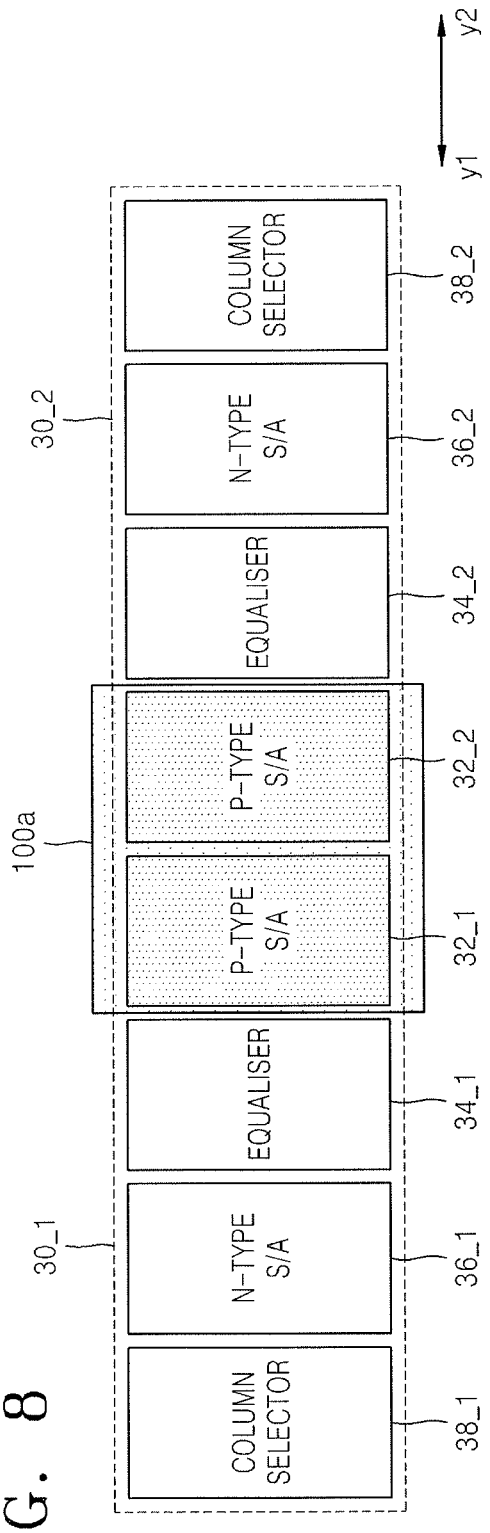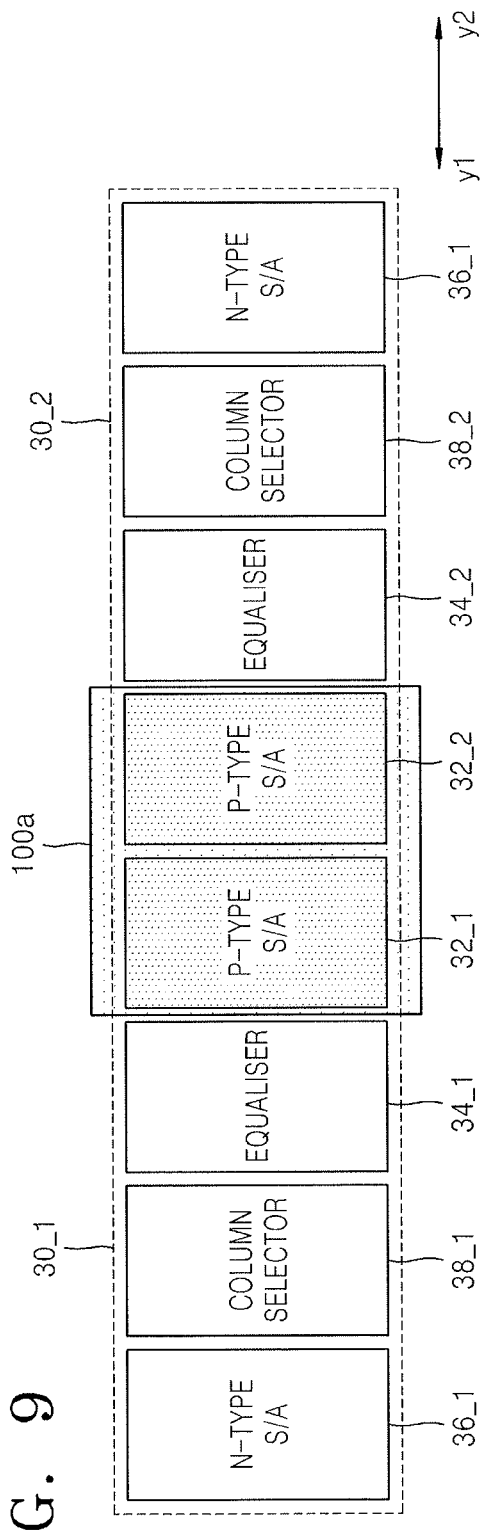

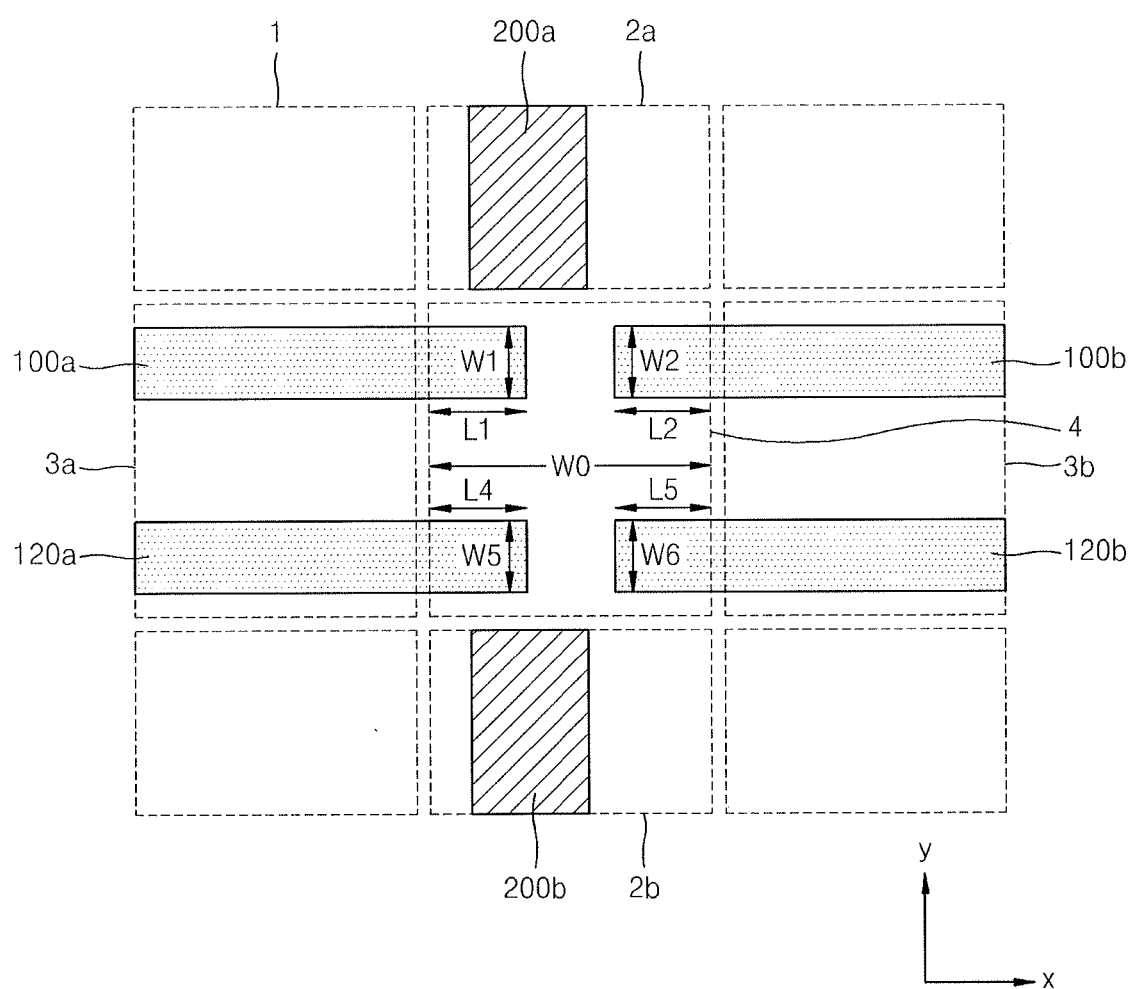

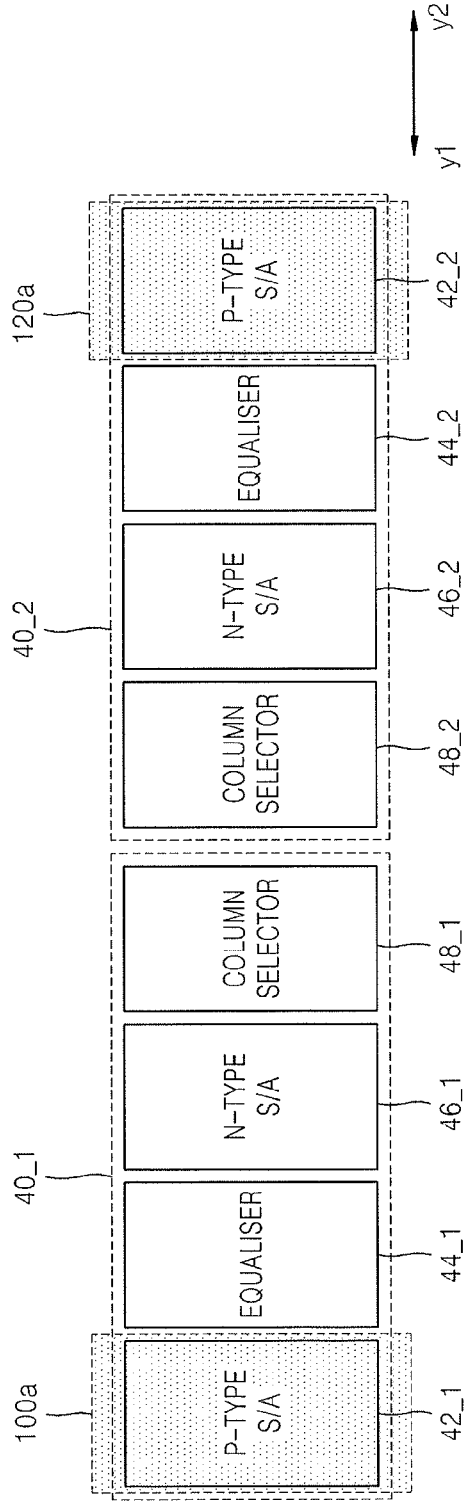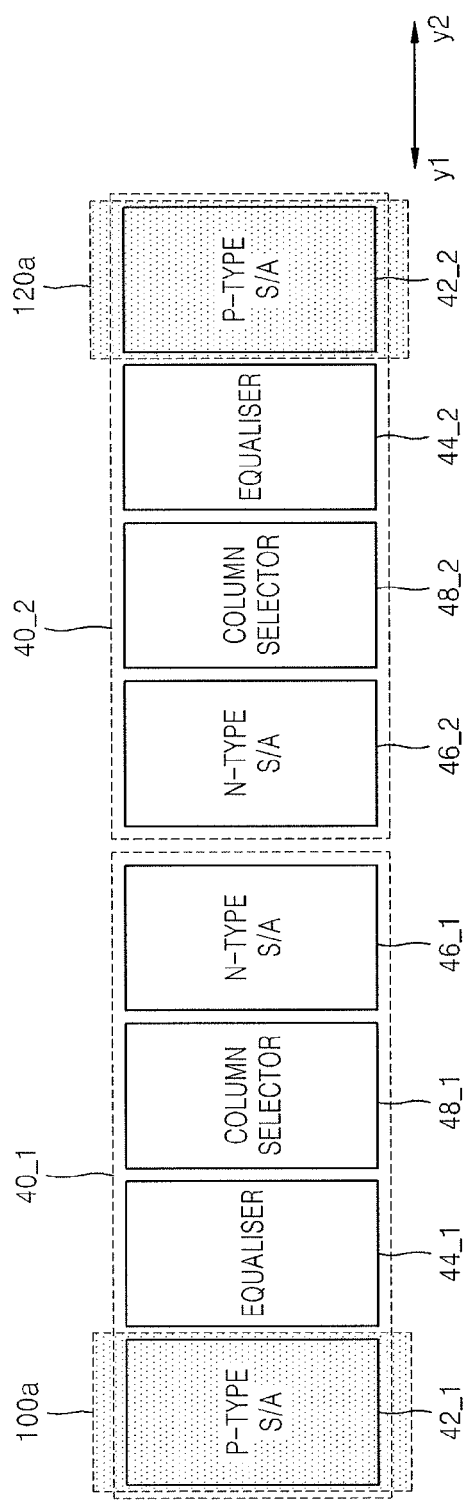

SEMICONDUCTOR MEMORY DEVICE

CROSS-REFERENCE TO RELATED APPLICATION

This application claims the benefit of Korean Patent Application No. 10-2012-0075173, filed on Jul. 10, 2012, in the Korean Intellectual Property Office, the disclosure of which is incorporated herein in its entirety by reference.

BACKGROUND

1. Field

The inventive concept relates to a semiconductor memory device, and more particularly, to a semiconductor memory device having an improved layout of a well with a sense amplifier circuit therein.

2. Description of the Related Art

In general, a semiconductor memory device includes a sense amplifier circuit for detecting data written in a plurality of memory cells. The sense amplifier circuit needs to be highly sensitive to stably detect the data. Recently, a design of the semiconductor memory device has become more complicated and a manufacturing process thereof has become minutely detailed according to user demand, which causes deterioration of the sensitivity of the sense amplifier circuit. For example, due to an influence of other wells adjacent to or crossing a well, in which transistors included in the sense amplifier circuit are formed, a threshold voltage of transistors of the sense amplifier circuit formed in a boundary of wells varies. In particular, such a variation in the threshold voltage may be problematic in a region including the sense amplifier circuit and other circuits crossing the sense amplifier circuit.

SUMMARY

The inventive concept provides a semiconductor memory device with a sense amplifier circuit having improved sensitivity by preventing a characteristic change of the sense amplifier circuit adjacent to a region, in which the sense amplifier circuit and other circuits cross each other.

According to an aspect of the inventive concept, there is provided a semiconductor memory device including a sense amplifier circuit region including first wells disposed in a first direction, a driving circuit region including second wells disposed in a second direction, and a conjunction region disposed at an intersection region of the sense amplifier circuit region and the driving circuit region, a part of each of the first wells extending from the sense amplifier circuit region into the conjunction region, and the second wells being outside of the conjunction region.

The at least a part of the first wells disposed in the conjunction region may include first and second partial wells extending from the sense amplifier circuit region at both sides of the conjunction region to the conjunction region and spaced apart from each other.

A length of the first partial well or the second partial well in the first direction may be greater than about 5% of a width of the conjunction region in the first direction.

Lengths of the first partial well and the second partial well in the first direction may be substantially identical to each other.

A third well that connects the first partial well and the second partial well may be further disposed in the conjunction region.

A width of the third well is different from widths of the first partial well and the second partial well.

The first wells may be disposed across the conjunction region in the first direction.

The conjunction region may overlap the center of the first wells, and further include a fourth well having the same type as the first wells.

A sub-word line driving circuit may be formed in the driving circuit region.

First and second sense amplifier circuits, in which a first sense amplifier, an equalizer, a second sense amplifier, and a column selector are sequentially disposed from the center of the sense amplifier circuit region to an outer side thereof, may be formed in the sense amplifier circuit region, wherein the first sense amplifiers of the first and second sense amplifier circuits are formed in the first wells.

First and second sense amplifier circuits, in which a first sense amplifier, an equalizer, a column selector, and a second sense amplifier are sequentially disposed from the center of the sense amplifier circuit region to an outer side thereof, may be formed in the sense amplifier circuit region, wherein the first sense amplifiers of the first and second sense amplifier circuits are formed in the first wells.

A fifth well spaced apart from the first wells and extending in the first direction may be further disposed in the sense amplifier circuit region, wherein at least a part of the fifth well is further disposed in the conjunction region.

First and second sense amplifier circuits in which a column selector, a second sense amplifier, an equalizer, and a first sense amplifier are sequentially disposed from the center of the sense amplifier circuit region to an outer side thereof may be formed in the sense amplifier circuit region, wherein the first sense amplifier of the first sense amplifier circuit is formed in the first wells, and wherein the first sense amplifier of the second sense amplifier circuit is formed in the fifth well.

First and second sense amplifier circuits in which a second sense amplifier, a column selector, an equalizer, and a first sense amplifier are sequentially disposed from the center of the sense amplifier circuit region to an outer side thereof may be formed in the sense amplifier circuit region, wherein the first sense amplifier of the first sense amplifier circuit is formed in the first wells, and wherein the first sense amplifier of the second sense amplifier circuit is formed in the fifth well.

According to another aspect of the inventive concept, there is provided a semiconductor memory device including a first region including first wells disposed in a first direction and a sense amplifier circuit, a second region including second wells disposed in a second direction, and a third region disposed at an intersection region of the first region and the second region, a part of each of the first wells extending from the first region into the third region, and the second wells being outside of third region.

According to another aspect of the inventive concept, there is provided a semiconductor memory device including a sense amplifier circuit region including first wells disposed in a first direction, a driving circuit region including second wells disposed in a second direction other than the first direction, and a conjunction region disposed at an intersection region of the sense amplifier circuit region and the driving circuit region, wherein the second wells being outside of the conjunction region.

A part of each of the first wells may be disposed in the conjunction region.

Each of the first wells may extend continuously from a respective sense amplifier circuit region into the conjunction region.

Two first wells may contact each other at the conjunction region.

A portion of the conjunction region may separate the first wells from the second wells along the second direction.

BRIEF DESCRIPTION OF THE DRAWINGS

Features will become apparent to those of ordinary skill in the art by describing in detail exemplary embodiments with reference to the attached drawings, in which:

FIG. 7 illustrates a conceptual layout diagram for explaining circuits formed in memory cell regions, a sense amplifier circuit region, and driving circuit regions of a semiconductor memory device to which a layout of wells is applied according to an embodiment of the inventive concept;

FIGS. 8 and 9 illustrate conceptual layout diagrams for explaining sense amplifier circuits formed in the sense amplifier circuit region of FIG. 7;

FIG. 10 illustrates a diagram for explaining a layout of wells in a semiconductor memory device according to another embodiment of the inventive concept;

FIGS. 13 and 14 are conceptual layout diagrams for explaining sense amplifier circuits formed in the sense amplifier circuit region of FIG. 12.

DETAILED DESCRIPTION

Figure 1:
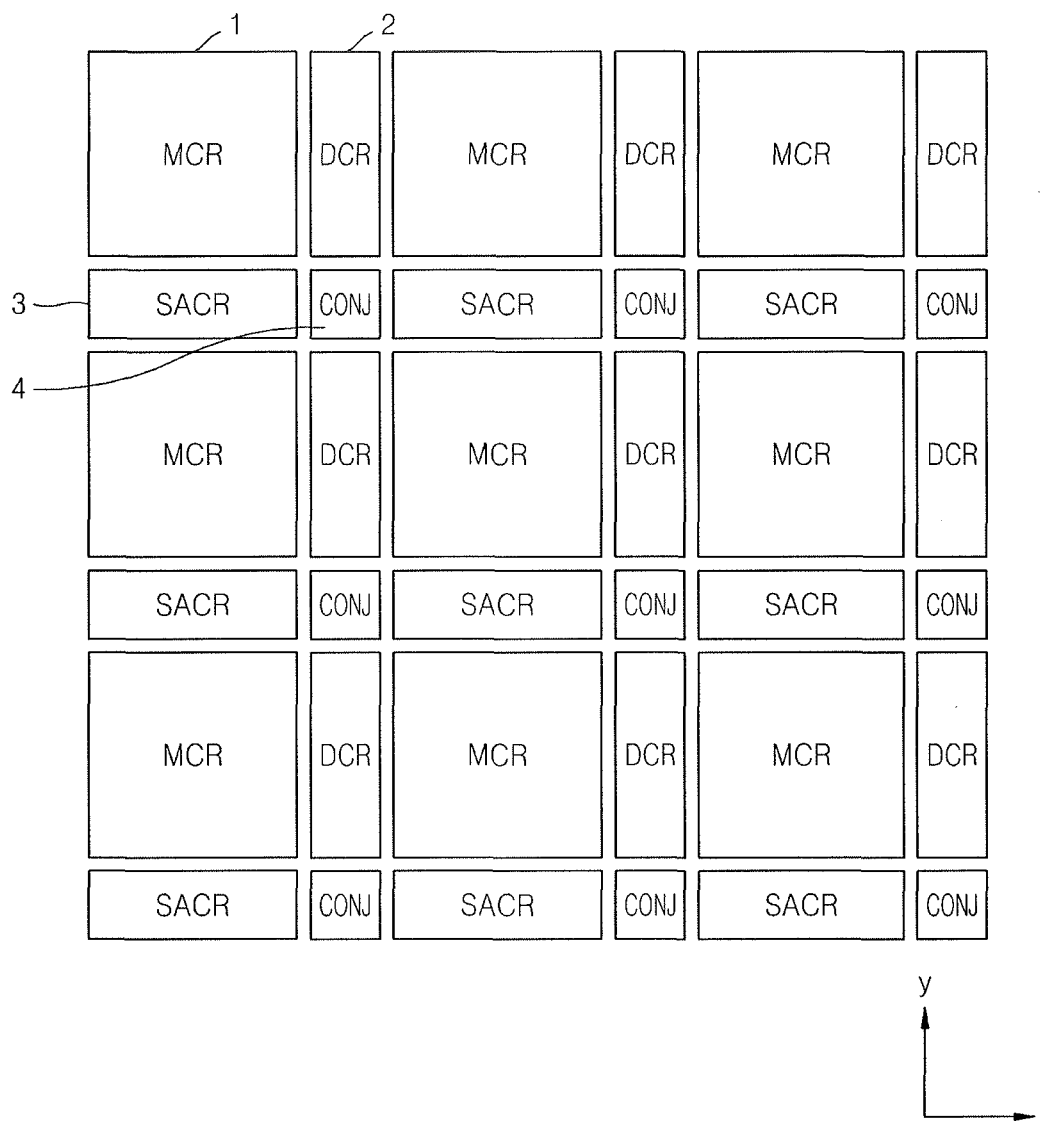
FIG. 1 illustrates a schematic block diagram of an overall layout of a semiconductor memory device according to an embodiment of the inventive concept.

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In the drawing figures, the dimensions of layers and regions may be exaggerated for clarity of illustration. It will also be understood that when a layer (or element) is referred to as being "on" another layer or substrate, it can be directly on the other layer or substrate, or intervening layers may also be present. In addition, it will also be understood that when a layer is referred to as being "between" two layers, it can be the only layer between the two layers, or one or more intervening layers may also be present. Like reference numerals refer to like elements throughout. Also, it will also be understood that when a layer is described as "connected to" or "coupled to" another layer, the layer may be directly connected to or coupled to the other layer, or a third layer may be interposed therebetween. Meanwhile, when a layer is "directly connected to" or "directly coupled to" another layer, a third layer may not be interposed therebetween.

The terms used in the present specification are merely used to describe particular embodiments, and are not intended to limit the example embodiments. An expression used in the singular encompasses the expression of the plural, unless it has a clearly different meaning in the context. In the present specification, it is to be understood that the terms such as "including" or "having," etc., are intended to indicate the existence of features, numbers, steps, actions, components, parts, or combinations thereof disclosed in the specification, and are not intended to preclude the possibility that one or more other features, numbers, steps, actions, components, parts, or combinations thereof may exist or may be added.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of exemplary embodiments.

Unless defined differently, all terms used in the description including technical and scientific terms have the same meaning as generally understood by one of ordinary skill in the art to which example embodiments belong. It will be further understood that terms, such as those defined in commonly used dictionaries, should be interpreted as having a meaning that is consistent with their meaning in the context of the relevant art and will not be interpreted in an idealized or overly formal sense unless expressly so defined herein. As used herein, the term "and/or" includes any and all combinations of one or more of the associated listed items.

FIG. 1 is a schematic block diagram of an overall layout of a semiconductor memory device according to an embodiment of the inventive concept.

Referring to FIG. 1, the semiconductor memory device may include repeatedly arranged memory cell regions MCR 1, driving circuit regions DCR 2, sense amplifier circuit regions SACR 3, and conjunction regions CONJ 4. Although the semiconductor memory device includes nine memory cell regions MCR 1, nine driving circuit regions DCR 2, nine sense amplifier circuit regions SACR 3, and nine conjunction regions CONJ 4 in FIG. 1, the semiconductor memory device may include any suitable, e.g., greater, number of each of the indicated regions as occasion demands.

The memory cell regions MCR 1 may include a plurality of memory cells. The memory cells may be, e.g., dynamic random access memory (DRAM) cells, resistive RAM (RRAM) cells, phase RAM (PRAM) cells, magnetic RAM (MRAM) cells, and/or spin transfer torque MRAM (STT-MRAM) cells. The memory cells may be disposed to have a folded bit line structure or an open bit line structure according to connection relationships between the memory cells and the sense amplifier circuit regions SACR 3. The memory cell regions MCR 1 may be driven in units of predetermined blocks.

The driving circuit regions DCR 2 may include a plurality of driving circuits for driving a plurality of memory cells connected to a plurality of word lines. The driving circuit regions DCR 2 may be, e.g., sub-word line driving circuits that implement a hierarchical word line structure by enabling the word lines in predetermined units. In the embodiments described below, the driving circuit regions DCR 2 are sub-word line driving circuit regions.

The sense amplifier circuit regions SACR 3 may include a plurality of sense amplifier circuits. The sense amplifier circuits may sense and amplify voltage levels of bit lines of the memory cell regions MCR 1. The sense amplifier circuits may be disposed according to a structure of the memory cell regions MCR 1, e.g., the folded bit line structure or the open bit line structure. In more detail, one sense amplifier circuit may be disposed in a four bit line pitch in the folded bit line structure, and one sense amplifier circuit may be disposed in a two bit line pitch in the open bit line structure. In the folded bit line structure, the sense amplifier circuits may be coupled to bit lines and complementary bit lines formed in parallel in the memory cell regions MCR 1 in one side with respect to the sense amplifier circuits. In the open bit line structure, the sense amplifier circuits may be coupled to bit lines and complementary bit lines formed in the different memory cell regions MCR 1 in both sides with respect to the sense amplifier circuits (see FIGS. 7 and 12 that will be described later). Each of the sense amplifier circuits may include, e.g., a first sense amplifier (hereinafter referred to as a P type sense amplifier), a second sense amplifier (hereinafter referred to as an N type sense amplifier), an equalizer, a column selector, etc. For example, the sense amplifier circuits may not include the column selectors or may further include other elements. For descriptive convenience, a case where the sense amplifier circuits include the P type sense amplifiers, the N type sense amplifiers, the equalizers, and the column selectors will be described below.

The conjunction regions CONJ 4 are regions in which the driving circuit regions DCR 2 and the sense amplifier circuit regions SACR 3 cross each other, and may include circuits other than the sub-word line driving circuits and the sense amplifier circuits. For example, the conjunction regions CONJ 4 may include control circuits for controlling the sub-word line driving circuits. Also, the conjunction regions CONJ 4 may include control circuits for providing the sense amplifier circuits with a driving voltage. Also, the conjunction regions CONJ 4 may include power gating circuits for blocking a leakage current path through the sub-word line driving circuits.

Figure 2:
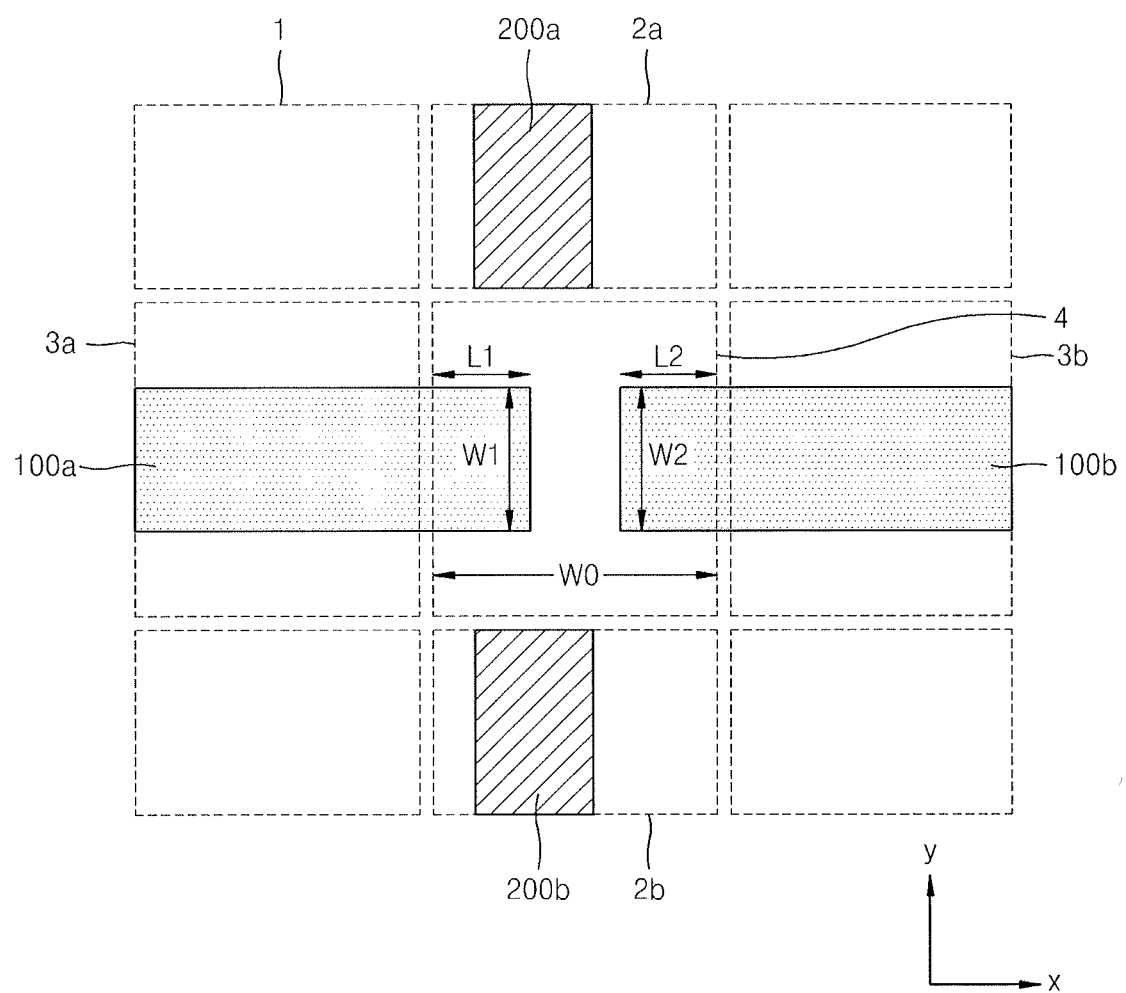
FIG. 2 illustrates a diagram for explaining a layout of wells in a semiconductor memory device according to an embodiment of the inventive concept.

FIG. 2 is a diagram for explaining a layout of wells in a semiconductor memory device according to an embodiment of the inventive concept. Although a substrate is not shown in FIG. 2 for descriptive convenience, it will be easily understood by one of ordinary skill in the art that each well is formed in the substrate. A case where the substrate is a P type substrate will be described below.

Referring to FIG. 2, second wells 200a and 200b may be disposed in driving circuit regions 2a and 2b, respectively, and first wells 100a and 100b may be disposed in sense amplifier circuit regions 3a and 3b, respectively. The first wells 100a and 100b may extend from respective sense amplifier circuit regions 3a and 3b to be partially disposed in a conduction region 4, but example embodiments are not limited thereto.

P type sense amplifiers among devices included in sense amplifier circuits may be formed in the corresponding first wells 100a and 100b disposed in the sense amplifier circuit regions 3a and 3b, respectively. In more detail, the first wells 100a and 100b may be N type wells, and P type MOS transistors included in the P type sense amplifiers may be formed in the N type first wells 100a and 100b. An N type sense amplifier, an equalizer, and a column selector may be formed in a region of the sense amplifier circuit regions 3a and 3b, in which the corresponding first wells 100a and 100b are not disposed, i.e., in the P type substrate.

Although not shown in FIG. 2, at least one P type well may be disposed in a region of the circuit regions 3a and 3b, in which the first wells 100a and 100b are not disposed, respectively. In this case, the P type wells may extend into the conjunction region 4 and to be partially disposed in the conjunction region 4, like the first wells 100a and 100b that will be described later. The N type sense amplifier, the equalizer, and the column selector may be formed in the same P type well or corresponding P type wells.

The first wells 100a and 100b may be disposed in a first direction, e.g., an x direction, in the sense amplifier circuit regions 3a and 3b, respectively. For example, the first wells 100a and 100b may be adjacent to each other along the x direction. Even though the first wells 100a and 100b are illustrated as being disposed in a straight line in the sense amplifier circuit regions 3a and 3b in FIG. 2, example embodiments are not limited thereto. For example, the first wells 100a and 100b may be disposed in the first direction at certain inclinations, e.g., at a certain angle with respect to the x direction. Also, the first wells 100a and 100b may be separately spaced apart from each other in the sense amplifier circuit regions 3a and 3b, respectively, e.g., the first wells 100a and 100b may be separated from each other in a boundary region between the sense amplifier circuits. The first wells 100a and 100b may be disposed having widths w1 and w2, respectively, in the sense amplifier circuit regions 3a and 3b, respectively, but the example embodiments are not limited thereto, and the widths w1 and w2 of the first wells 100a and 100b may be different in specific portions. For example, the widths w1 and w2 of the first wells 100a and 100b may be different in the boundary region between the sense amplifier circuits. The widths w1 and w2 of the first wells 100a and 100b may be identical to each other but example embodiments are not limited thereto. The first wells 100a and 100b may be diagonally disposed in the sense amplifier circuit regions 3a and 3b, respectively, but example embodiments are not limited thereto.

The first well 100a disposed in the sense amplifier circuit region 3a may partially extend (for example, a first partial well) to be disposed in the conjunction region 4. The first well 100b disposed in the sense amplifier circuit region 3b may partially extend (for example, a second partial well) to be disposed in the conjunction region 4. In other words, the first well 100a may be formed to extend from the sense amplifier circuit region 3a to a part of the conjunction region 4, and the first well 100b may be formed to extend from the sense amplifier circuit region 3b to a part of the conjunction region 4. The parts of the first well 100a and 100b in the conjunction region 4 may be spaced apart from each other, e.g., have a predetermined distance along the x direction therebetween.

Lengths L1 and L2 of the first wells 100a and 100b, respectively, refer to lengths along the first direction, e.g., along the x direction, of the first wells 100a and 100b, respectively, in the conjunction region 4. The lengths L1 and L2 may be determined in consideration of a device characteristic of a P type sense amplifier formed in a boundary of the conjunction region 4 and the sense amplifier circuit regions 3a and 3b. That is, values of the lengths L1 and L2 of the first well 100a and 100b that extend in the first direction may be determined such that threshold voltage values of P type MOS transistors included in the P type sense amplifier may be the same as threshold voltage values of P type MOS transistors included in another P type sense amplifier of the sense amplifier circuit regions 3a and 3b. For example, each of the lengths L1 and L2 of the first well 100a and 100b that extend in the first direction may be greater than about 5% of a width w0 of the conjunction region 4 in the first direction.

The lengths L1 and L2 of the first well 100a and 100b that extend in the first direction may be identical to each other but example embodiments are not limited thereto, e.g., the lengths L1 and L2 of the first well 100a and 100b that extend in the first direction may be different from each other. To equalize characteristics of the sense amplifier circuits disposed in the sense amplifier circuit regions 3a and 3b, the lengths L1 and L2 of the first well 100a and 100b that extend in the first direction may be identical to each other.

MOS transistors included in circuits disposed in the conjunction region 4 may be formed in each part of the first wells 100a and 100b disposed in the conjunction region 4. For example, the P type MOS transistors included in the control circuits for controlling the sub-word line driving circuits or the control circuits for providing the sense amplifier circuits may be formed in portions of the first wells 100a and 100b in the conjunction region 4. N type MOS transistors included in the control circuits for controlling the sub-word line driving circuits or the control circuits for providing the sense amplifier circuits may be formed in a region of the conjunction region 4 in which the first wells 100a and 100b are not disposed. Like in the sense amplifier circuit regions 3a and 3b, at least one P type well may be formed in the region of the conjunction region 4 in which the first wells 100a and 100b are not disposed, and the N type MOS transistors may be formed in the P type well. Also, in a case where P type wells are formed in the region of the sense amplifier circuit regions 3a and 3b in which the corresponding first wells 100a and 100b are not disposed, and may extend into the conjunction region 4, the N type MOS transistors may be formed in the P type well extending from the sense amplifier circuit regions 3a and 3b into the conjunction region 4.

P type MOS transistors among devices included in the sub-word line driving circuits may be formed in the second wells 200a and 200b disposed in the driving circuit regions 2a and 2b, respectively. The second wells 200a and 200b may be the same N type as the first wells 100a and 100b. In a case where the second wells 200a and 200b are the same N type as the first wells 100a and 100b, doping concentration of N type impurities, depths of the second wells 200a and 200b, etc. may be the same as or different from those of the first wells 100a and 100b. N type MOS transistors among the devices included in the sub-word line driving circuits may be formed in a region of the driving circuit regions 2a and 2b in which the corresponding second wells 200a and 200b are not disposed. Like in the sense amplifier circuit regions 3a and 3b, at least one P type well may be formed in the region of the driving circuit regions 2a and 2b in which the second wells 200a and 200b are not disposed, whereas the P type well may not extend into the conjunction region 4, e.g., like the second wells 200a and 200b that will be described later. The N type MOS transistors among the devices included in the sub-word line driving circuits may be formed in the P type well.

The second wells 200a and 200b may be disposed in a second direction, for example, a y direction, in the driving circuit regions 2a and 2b, respectively. The second wells 200a and 200b may be disposed in a straight line in the driving circuit regions 2a and 2b, respectively, in FIG. 2 but example embodiments are not limited thereto, e.g., the second wells 200a and 200b may be disposed at certain inclinations. Also, the second wells 200a and 200b may be separately spaced apart from each other in the driving circuit regions 2a and 2b, respectively. For example, the second wells 200a and 200b may be separated from each other in a boundary region between the sub-word line driving circuits. The second wells 200a and 200b may have uniform widths or may have different widths in specific portions. For example, the second wells 200a and 200b may have different widths in the boundary region between the sub-word line driving circuits. The second wells 200a and 200b may be diagonally disposed in the driving circuit regions 2a and 2b, respectively, but example embodiments are not limited thereto.

Unlike the first wells 100a and 100b, the second wells 200a and 200b may not be disposed in the conjunction region 4 but may be disposed outside of the conjunction region 4. In other words, the second wells 200a and 200b may not extend from the driving circuit regions 2a and 2b into the conjunction region 4 but are formed only in the driving circuit regions 2a and 2b, respectively.

In a process of forming the second wells 200a and 200b, e.g., an implant process, impurities may be injected into a region in close proximity to an implant target region, thereby potentially affecting circuits in the proximity region, i.e., a well proximity effect (WPE). Thus, if at least a part of the second wells 200a and 200b extended from the driving circuit regions 2a and 2b into the conjunction region 4, device characteristics of sense amplifier circuits formed on a region adjacent to the boundary of the conjunction region 4 and the sense amplifier circuit regions 3a and 3b in the sense amplifier circuit regions 3a and 3b would vary, e.g., a threshold voltage of the MOS transistors included in the sense amplifier circuits may vary.

However, as the second wells 200a and 200b are disposed outside, e.g., completely outside, of the conjunction region 4, while only the first wells 100a and 100b extend from the sense amplifier circuit regions 3a and 3b to be partially disposed in the conjunction region 4 in accordance with example embodiments, the sense amplifier circuits formed in the boundary of the conjunction region 4 and the sense amplifier circuit regions 3a and 3b may maintain continuity, e.g., of impurity concentration, and may not be affected by the second wells 200a and 200b. Therefore, the sense amplifier circuits formed in the boundary of the conjunction region 4 and the sense amplifier circuit regions 3a and 3b may have the same characteristics as the sense amplifier circuits formed only in the sense amplifier circuit regions 3a and 3b, and may have improved sensitivity. A semiconductor memory device including the sense amplifier circuits having the improved sensitivity may smoothly detect data.

Figure 3:
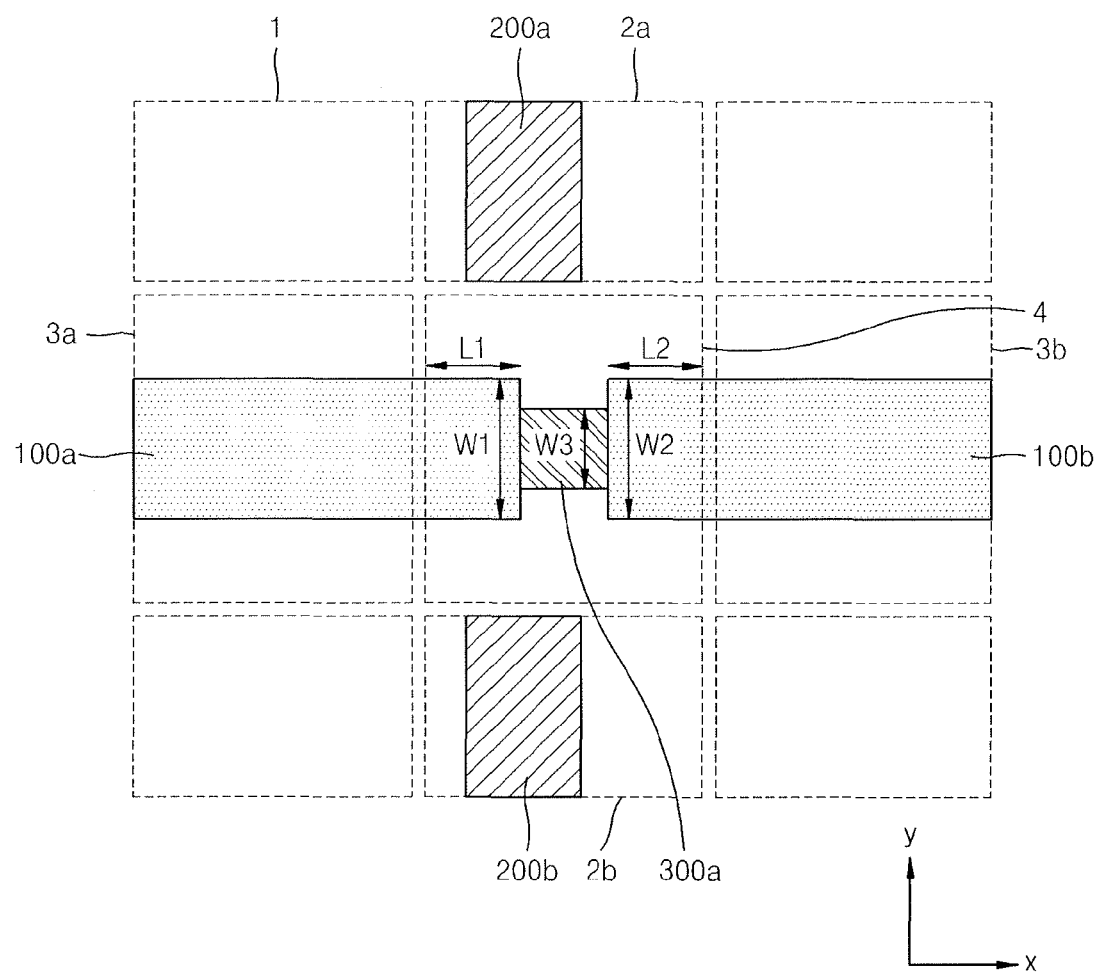
FIGS. 3 and 4 illustrate diagrams for explaining modifications of the layout of the wells of FIG. 2.
Figure 4:
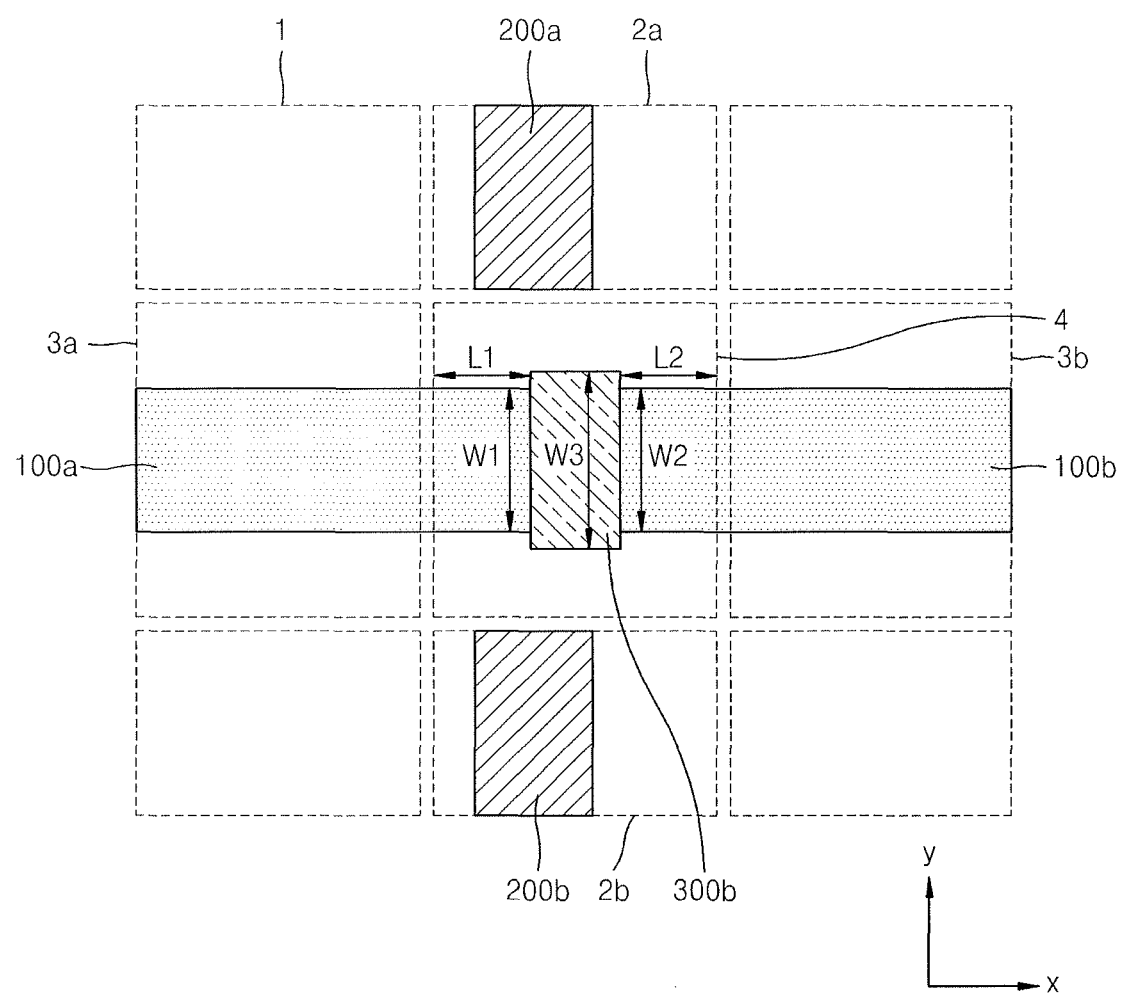

FIGS. 3 and 4 are diagrams for explaining modifications of the layout of the wells of FIG. 2. FIGS. 3 and 4 will be described with reference to FIG. 2. Like reference numerals in FIGS. 2 through 4 denote like elements, and thus repeated descriptions thereof will be omitted.

Referring to FIGS. 3-4, third wells 300a and 300b that connect parts of the first wells 100a and 100b may be further disposed in the conjunction region 4. For example, each of the third wells 300a and 300b of respective FIGS. 3 and 4 may be positioned entirely in the conjunction region 4 to connect facing edges of respective first wells 100a and 100b, e.g., into a linear shape.

For example, the third well 300a of FIG. 3 may have a width w3 smaller than the widths w1 and w2 of the first wells 100a and 100b. However, the width w3 of the third well 300a of FIG. 3 is not limited thereto, e.g., a width of a specific part of the third well 300a may be greater or smaller than the width w3 in FIG. 3. Also, the third well 300a is disposed in a straight line in a first direction, e.g., an x direction in FIG. 3, but example embodiments are not limited thereto, e.g., the third well 300a may be disposed in the first direction at a uniform inclination with respect to the x direction.

In another example, the third well 300b of FIG. 4 may have a width w4 greater than the widths w1 and w2 of the first wells 100a and 100b. Like the third well 300a, the third well 300b may have a width w3, and a width of a specific part of the third well 300b may be greater or smaller than the width w3 of FIG. 4. Also, the third well 300b may be disposed in a straight line in the first direction or may be disposed in the first direction at a uniform inclination.

The third wells 300a and 300b may be the same N type wells as the first wells 100a and 100b and the second wells 200a and 200b. In a case where the third wells 300a and 300b are the same N type wells as the first wells 100a and/or 100b and the second wells 200a and 200b, doping concentration of N type impurities, depths of the third wells 300a and 300b, etc. may be the same as or different from those of the first wells 100a and/or 100b and the second wells 200a and 200b. P type MOS transistors included in circuits disposed in the conjunction region 4 may be formed in the third wells 300a and 300b.

Whether the third well 300a or the third well 300b is disposed in the conjunction region 4 may be determined according to conductivity types of MOS transistors included in the circuits formed in the conjunction region 4. For example, when the above-described control circuits or power gating circuits are disposed in the conjunction region 4 and include a plurality of N type MOS transistors, the third well 300a may be disposed in the conjunction region 4, whereas when the circuits include a plurality of P type MOS transistors, the third well 300b may be disposed in the conjunction region 4.

Figure 5:
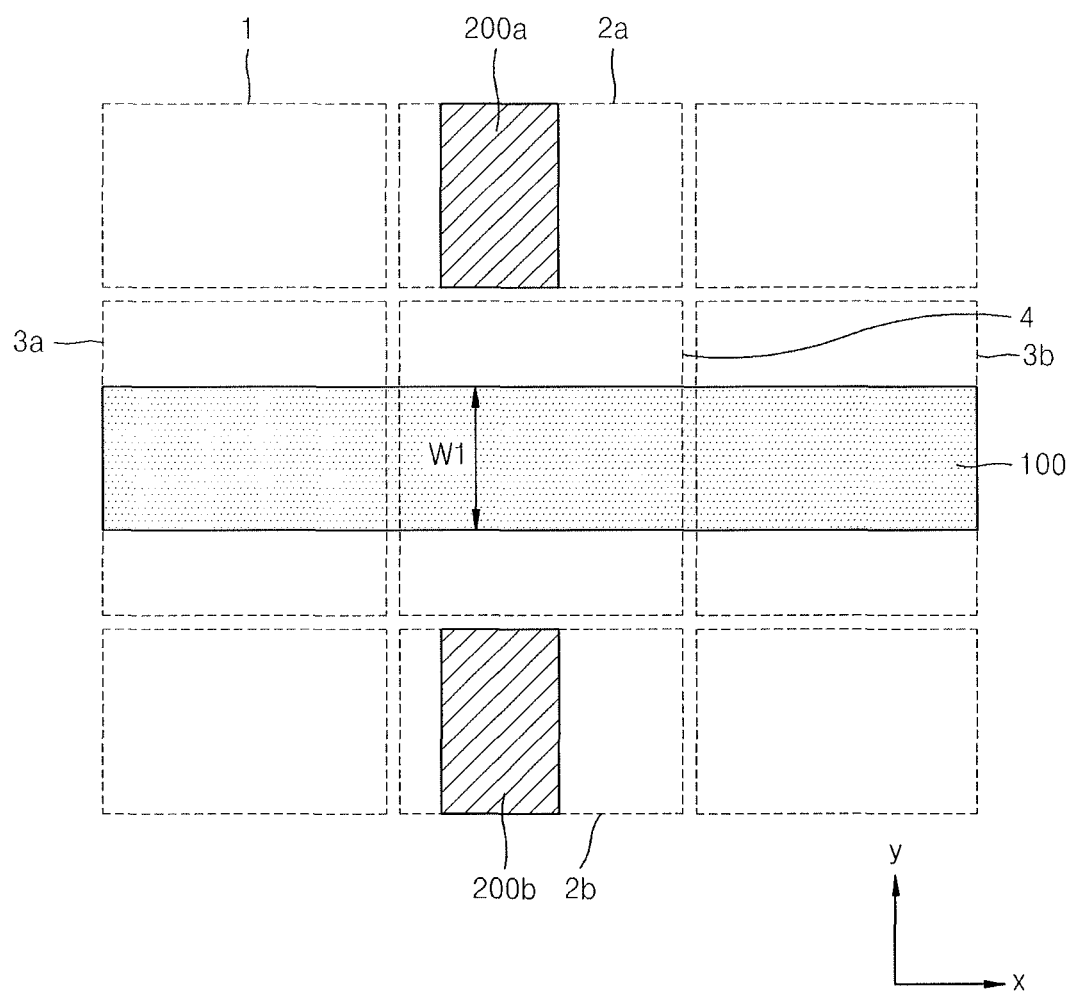
FIG. 5 illustrates a diagram for explaining a layout of wells in a semiconductor memory device according to another embodiment of the inventive concept.

FIG. 5 is a diagram for explaining a layout of wells in a semiconductor memory device according to another embodiment of the inventive concept. Only differences between FIGS. 2 and 5 will be described herein. Like reference numerals in FIGS. 2 and 5 denote like elements, and thus repeated descriptions thereof will be omitted.

Referring to FIGS. 2 and 5, a first well 100 may be disposed in the sense amplifier circuit regions 3a and 3b and the conjunction region 4, and the second wells 200a and 200b may be disposed in the driving circuit regions 2a and 2b, respectively.

A P type sense amplifier among devices included in sense amplifier circuits described above may be formed in the first well 100 disposed in the sense amplifier circuit regions 3a and 3b. In more detail, the first well 100 may be an N type well, and P type MOS transistors may be formed in the first well 100. An N type sense amplifier, an equalizer, a column selector, etc. may be formed in a region of the sense amplifier circuit regions 3a and 3b in which the first well 100 is not disposed.

The first well 100 may be disposed in a first direction, e.g., an x direction, from the sense amplifier circuit region 3a to the sense amplifier circuit region 3b through the conjunction region 4. That is, unlike in FIG. 2, the first well 100 may continuously extend from the sense amplifier circuit region 3a to the sense amplifier circuit region 3b through the conjunction region 4, i.e., may not be separated in the conjunction region 4 but may be disposed across the conjunction region 4. The first well 100 may have the width w1 and may have a different width at a specific part thereof, e.g., may have non-uniform width. For example, the first well 100 disposed in the sense amplifier circuit regions 3a and 3b may have a different width in a boundary region of sense amplifier circuits.

Like in FIG. 2, the second wells 200a and 200b are disposed, e.g., only, outside of the conjunction region 4, and the first well 100 is disposed across the conjunction region 4. Thus, sense amplifier circuits formed at a boundary of the sense amplifier circuit regions 3a and 3b and the conjunction region 4 may have the same characteristics as sense amplifier circuits formed in the sense amplifier circuit regions 3a and 3b.

Figure 6:
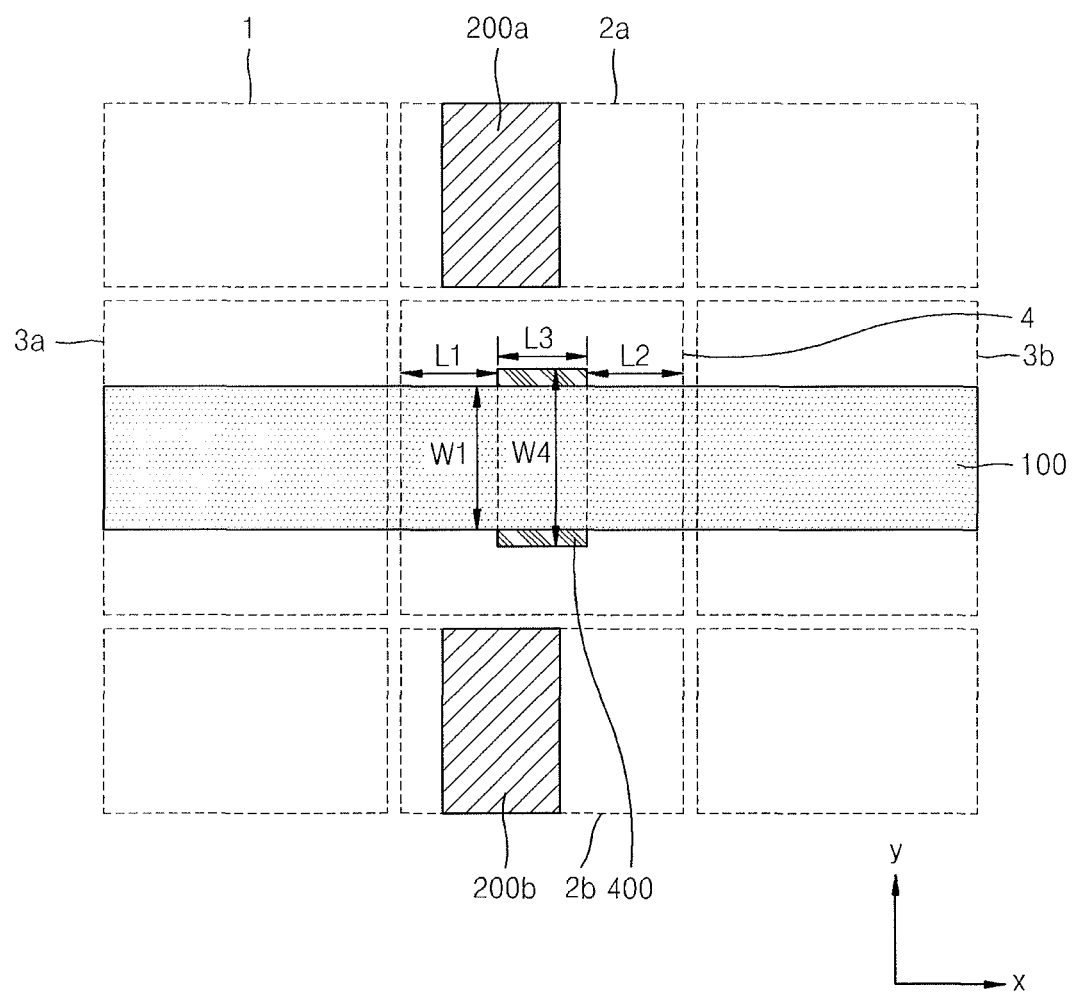
FIG. 6 illustrates a diagram for explaining a modification of the layout of the wells of FIG. 5.

FIG. 6 is a diagram for explaining a modification of the layout of the wells of FIG. 5. FIG. 6 will be described with reference to FIGS. 2 and 5. Like reference numerals in FIGS. 2, 5, and 6 denote like elements, and thus repeated descriptions thereof will be omitted.

Referring to FIGS. 2, 5, and 6, a fourth well 400 that overlaps the first well 100 and has the same type as the first well 100 may be further disposed in the conjunction region 4. The fourth well 400 may overlap, e.g., the center of, the first well 100 in the conjunction region 4 in order to equalize characteristics of sense amplifier circuits formed in a boundary of the sense amplifier circuit regions 3a and 3b and the conjunction region 4. For example, the fourth well 400 may overlap the center of the first well 100 such that the lengths L1 and L2 of both sides of the first well 100 with respect to the center of the fourth well 400 may be identical to each other. A length L3 of the fourth well 400 may be determined in consideration of the lengths L1 and L2 of the first well 100 that allow device characteristics of P type sense amplifiers formed in the sense amplifier circuit regions 3a and 3b and the conjunction region 4 to be the same as device characteristics of P type sense amplifiers formed in the sense amplifier circuit regions 3a and 3b. The fourth well 400 may have a width w4 greater than the width w1 of the first well 100. Although the fourth well 400 has the width w4 in FIG. 6, the fourth well 400 may have a different width at a specific part thereof. Meanwhile, the fourth well 400 is formed before the first well 100 is formed in FIG. 6, but example embodiments are not limited thereto. The fourth well 400 may be formed after the first well 100 is formed.

As described with reference to FIGS. 3 and 4, in a case where the above-described control circuits or power gating circuits disposed in the conjunction region 4 include a plurality of P type MOS transistors, the fourth well 400 may be further disposed in the conjunction region 4.

FIG. 7 is a conceptual layout diagram for explaining circuits formed in memory cell regions 1a and 1b, a sense amplifier circuit region 3a, and driving circuit regions 2a and 2b of a semiconductor memory device to which a layout of wells is applied according to an embodiment of the inventive concept. FIG. 7 shows the semiconductor memory device to which a layout of the wells described with reference to FIG. 2 is applied, but example embodiments are not limited thereto. A layout of the wells described with reference to FIGS. 3 through 6 may be applied to the semiconductor memory device. Also, an open bit line structure is employed in the semiconductor memory device of FIG. 7 but is not limited thereto. A folded bit line structure may be applied to the semiconductor memory device.

Referring to FIG. 7, memory cells 10 may be disposed in a location of the memory cell region 1a in which word lines WLn-3 through WLn-1 extending in a first direction, e.g., an x direction, and bit lines BL0 through BL3 extending in a second direction, e.g., a y direction, cross each other. The memory cells 10 may be disposed in a location of the memory cell region 1b in which the word lines WLn-3 through WLn-1 extending in the first direction and the bit lines BL0 through BL3 extending in the second direction cross each other. The first direction and the second direction are perpendicular to each other in FIG. 7 but example embodiments are not limited thereto. The first direction and the second direction may have a predetermined angle. For descriptive convenience, the memory cells 10 disposed in a location in which some word lines and bit lines cross each other are shown in FIG. 7 but the other memory cells 100 may be disposed in the same manner as described above. The memory cells 10 may include, e.g., DRAM, RRAM, PRAM, or STT_MRAM, etc. as described with reference to FIG. 1.

Sub-word line driving circuits 20 coupled to the word lines WLn-3 through WLn-1 may be disposed in the driving circuit region 2a. The sub-word line driving circuits 20 coupled to the word lines WLn-3 through WL-n-1 may be disposed in the driving circuit region 2b.

A sense amplifier circuit 30_1 coupled to the bit line BL0 and a complementary bit line BLB0, a sense amplifier circuit 302 coupled to the bit line BL1 and a complementary bit line BLB1, a sense amplifier circuit 30_3 coupled to the bit line BL2 and a complementary bit line BLB2, and a sense amplifier circuit 30_4 coupled to the bit line BL3 and a complementary bit line BLB3 may be disposed in the sense amplifier circuit region 3a. For descriptive convenience, only the sense amplifier circuits 30_1 through 30_4 are shown but other sense amplifier circuits may be disposed in the same manner as described above.

Each of the sense amplifier circuits 30_1 through 30_4 may include a P type sense amplifier, an N type sense amplifier, an equalizer, and a column selector. The P type sense amplifier may include P type MOS transistors. The N type sense amplifier, the equalizer, and the column selector may include N type MOS transistors.

The sense amplifier circuits 30_1 and 30_2 may be inverted with respect to each other. For example, in a case where the sense amplifier circuit 30_1 sequentially includes the P type sense amplifier, the N type sense amplifier, the equalizer, and the column selector in the second direction, the sense amplifier circuit 30_2 may sequentially include the column selector, the equalizer, the N type sense amplifier, and the P type sense amplifier in the second direction. In other words, internal structures of the sense amplifier circuits 30_1 and 30_2 may be diagonal with respect to each other based on the center of the sense amplifier circuit region 3a, e.g., see line BLB0 extending from a top of the sense amplifier circuit 30_2 toward a bottom of the sense amplifier circuit 30_1. The sense amplifier circuits 30_3 and 30_4 may be inverted with diagonally arranged internal structures with respect to each other, as described with references to the sense amplifier circuits 30_1 and 30_2. The construction of the sense amplifier circuits 30_1 and 30_2 will be described in more detail with reference to FIGS. 8 and 9 below.

As described with reference to FIG. 1, control circuits (not shown) for controlling the sub-word line driving circuits 20 and control circuits (not shown) for providing driving voltages with the sense amplifier circuits 30_1 through 30_4 may be disposed in the conjunction region 4. Also, power gating circuits (not shown) may be disposed in the conjunction region 4.

FIGS. 8 and 9 are conceptual layout diagrams for explaining the sense amplifier circuits 30_1 and 30_2 formed in the sense amplifier circuit region 3a of FIG. 7. Although the sense amplifier circuits 30_1 and 30_2 are shown in FIGS. 8 and 9, the sense amplifier circuits 30_3 and 30_4 may have the same construction and layout as those of the sense amplifier circuits 30_1 and 30_2.

Referring to FIGS. 7 and 8, a column selector 38_1, an N type sense amplifier 36_1, an equalizer 34_1, and a P type sense amplifier 32_1 may be sequentially disposed from a first side y1 to a second side y2 in the sense amplifier circuit 30_1. A P type sense amplifier 32_2, an equalizer 34_2, an N type sense amplifier 36_2, and a column selector 38_2 may be sequentially disposed from the first side y1 to the second side y2 in the sense amplifier circuit 30_2.

The P type sense amplifiers 32_1 and 32_2 of the sense amplifier circuits 30_1 and 30_2, respectively, may be formed in the first well 100a that is an N type well. The equalizers 34_1 and 34_2, the N type sense amplifiers 36_1 and 36_2, and the column selectors 38_1 and 38_2 of the sense amplifier circuits 30_1 and 302, respectively, may be formed in a P type substrate that is a region in which the first well 100a is not formed. With respect to the N type sense amplifiers 36_1 and 36_2 and the column selectors 38_1 and 382, transistors included in each device are circuits that are paired.

In a case where the transistors are formed in proximity to the first well 100a that is the N type well, a threshold voltage of the transistors that are paired may vary due to the WPE. Accordingly, sensitivity may deteriorate. However, in the present embodiment, since the N type sense amplifiers 36_1 and 36_2 and the column selectors 38_1 and 38_2 are spaced apart from the first well 100a, in which the P type sense amplifiers 32_1 and 32_2 are formed, by the respective equalizers 34_1 and 34_2, the sensitivity of the sense amplifier circuits 30_1 and 30_2 may be prevented from being deteriorated.

Also, as described above, in the sense amplifier circuits 30_1 and 30_2 formed at a boundary of the sense amplifier circuit region 3a and the conjunction region 4, continuity of impurity concentration is secured due to the first well 100a extending from the sense amplifier circuit region 3a to the conjunction region 4, which may prevent a threshold voltage of the P type sense amplifiers 32_1 and 32_2 from deteriorating, and due to the second wells 200a and 200b that are N type wells not being disposed in the conjunction region 4, which may prevent a threshold voltage of the N type sense amplifiers 36_1 and 36_2 and the column selectors 38_1 and 38_2 from deteriorating. That is, the sense amplifier circuits 30_1 and 30_2 may prevent the sensitivity from deteriorating both due to the WPE in a boundary region and due to the WPE according to an arrangement of the transistors included in the sense amplifier circuits 30_1 and 30_2. Therefore, a semiconductor memory device including the sense amplifier circuits 30_1 and 30_2 may more accurately and stably detect data.

Referring to FIGS. 7 and 9, the N type sense amplifier 36_1, the column selector 38_1, the equalizer 34_1, and the P type sense amplifier 32_1 may be sequentially disposed from the first side y1 to the second side y2 in the sense amplifier circuit 30_1. The P type sense amplifier 32_2, the equalizer 34_2, the column selector 38_2, and the N type sense amplifier 36_2 may be sequentially disposed from the first side y1 to the second side y2 in the sense amplifier circuit 30_2. Like in FIG. 8, in a case where the sense amplifier circuits 30_1 and 30_2 are disposed as shown in FIG. 9, the sense amplifier circuits 30_1 and 30_2 may prevent the sensitivity from deteriorating.

FIG. 10 is a diagram for explaining a layout of wells in a semiconductor memory device according to another embodiment of the inventive concept. Only differences between FIGS. 2 and 10 will be described herein. Like reference numerals in FIGS. 2 and 10 denote like elements, and thus repeated descriptions thereof will be omitted.

Referring to FIGS. 2 and 10, fifth wells 120a and 120b may be further disposed in the sense amplifier circuit regions 3a and 3b, respectively, in addition to the first wells 100a and 100b. The first wells 100a and 100b and the fifth wells 120a and 120b disposed in the sense amplifier circuit regions 3a and 3b, respectively, may partially extend and be disposed in the conjunction region 4.

P type sense amplifiers among devices included in sense amplifier circuits may be formed in the fifth wells 120a and 120b disposed in the sense amplifier circuit regions 3a and 3b, respectively, like the first wells 100a and 100b. The fifth wells 120a and 120b may be N type wells. Also, the fifth wells 120a and 120b may be disposed in the first direction or in a straight line or at uniform inclinations in the sense amplifier circuit regions 3a and 3b, respectively. Also, the fifth wells 120a and 120b may be separately formed by a predetermined distance in a boundary region of the sense amplifier circuits formed in the sense amplifier circuit regions 3a and 3b, respectively, and may have different widths. Widths w5 and w6 of the fifth wells 120a and 120b may be identical to or different from each other. The widths w5 and w6 of the fifth wells 120a and 120b may be identical to or different from the widths w1 and w2 of the first wells 100a and 100b. The fifth wells 120a and 120b may be diagonally disposed in the sense amplifier circuit regions 3a and 3b, respectively, but example embodiments are not limited thereto.

The fifth well 120a may extend from the sense amplifier circuit region 3a and be partially disposed in the conjunction region 4. The fifth well 120b may extend from the sense amplifier circuit region 3b and be partially disposed in the conjunction region 4. That is, like the first wells 100a and 100b, the fifth wells 120a and 120b may be spaced apart from each other.

Lengths L4 and L5 of the fifth wells 120a and 120b that extend in the first direction may be determined in consideration of a device characteristic of a P type sense amplifier formed in a boundary of the conjunction region 4 and the sense amplifier circuit regions 3a and 3b. For example, the lengths L4 and L5 of the fifth wells 120a and 120b may be greater than about 5% of the width w0 of the conjunction region 4 in the first direction.

The length L4 of the fifth well 120a disposed in the conjunction region 4 in the first direction may be the same as the length L5 of the fifth well 120b disposed in the conjunction region 4 in the first direction. To equalize characteristics of the sense amplifier circuits disposed in the sense amplifier circuit regions 3a and 3b, the lengths L4 and L5 of the fifth wells 120a and 120b that extend in the first direction may be identical to each other. Also, although the lengths L4 and L5 of the fifth wells 120a and 120b that extend in the first direction may be different from the lengths L1 and L2 of the first wells 100a and 100b that extend in the first direction, the lengths L4 and L5 may be the same as the lengths L1 and L2. MOS transistors included in circuits disposed in the conjunction region 4 may be formed in the fifth wells 120a and 120b disposed in the conjunction region 4. Although not shown, as described with reference to FIGS. 3 and 4, wells that connect parts of the fifth wells 120a and 120b may be further disposed in the conjunction region 4.

Like in FIG. 2, the second wells 200a and 200b are disposed, e.g., only, outside of the conjunction region 4, and the first wells 100a and 100b and the fifth wells 120a and 120b extend from the sense amplifier circuit regions 3a and 3b, respectively, and are partially disposed in the conjunction region 4. Thus, the sense amplifier circuits formed in the boundary of the conjunction region 4 and the sense amplifier circuit regions 3a and 3b may maintain continuity of, e.g., impurity concentration, and may not be affected by the second wells 200a and 200b. Therefore, sensitivity of the sense amplifier circuits may be improved in the semiconductor memory device employing the layout of the wells according to the above embodiment.

Figure 11:
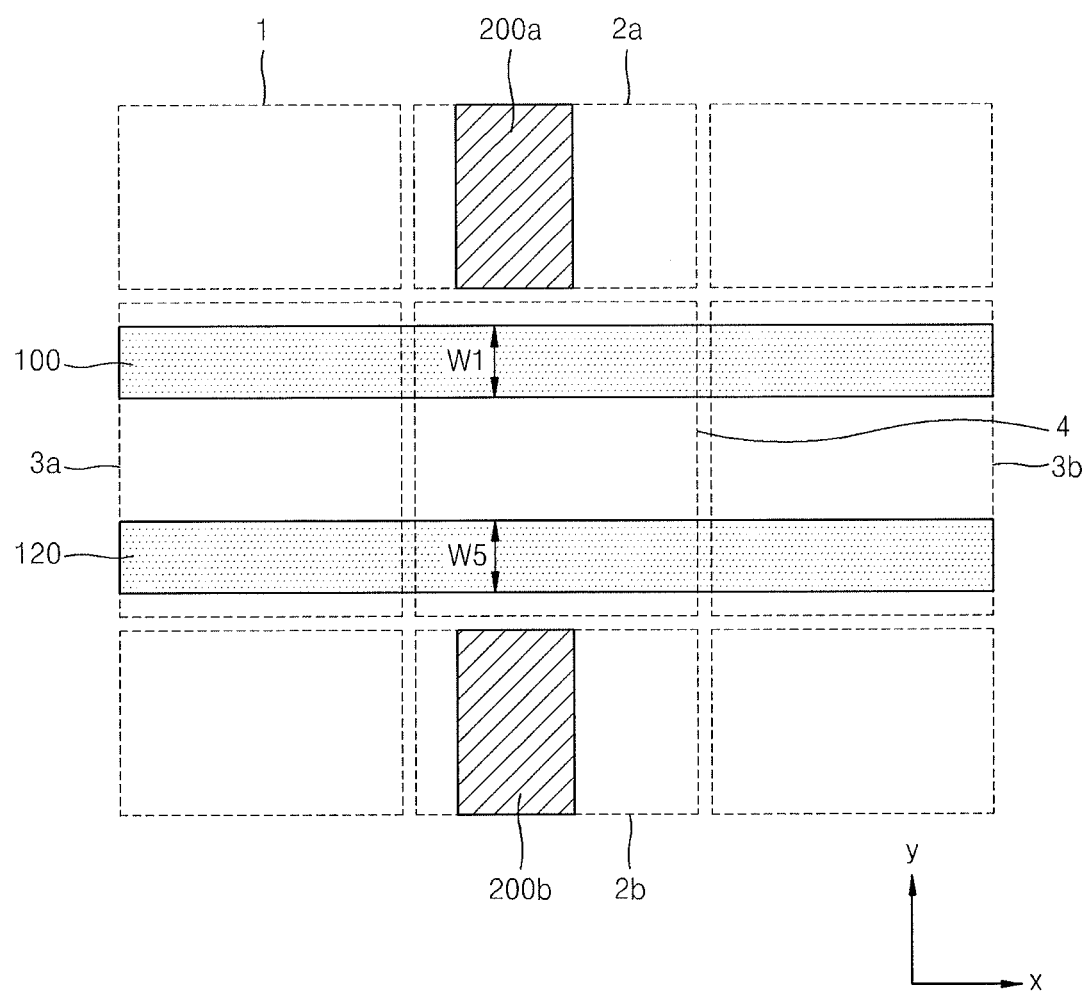
FIG. 11 illustrates a diagram for explaining a modification of the layout of the wells of FIG. 10.

FIG. 11 is a diagram for explaining a modification of the layout of the wells of FIG. 10. Only differences between FIGS. 10 and 11 will be described here. Like reference numerals in FIGS. 10 and 11 denote like elements, and thus repeated descriptions thereof will be omitted.

Referring to FIGS. 10 and 11, a fifth well 120 may be disposed in the sense amplifier circuit regions 3a and 3b and the conjunction region 4, in addition to the first well 100. The fifth well 120 may be an N type well like the first well 100. A P type sense amplifier among devices included in a sense amplifier circuit may be formed in the fifth well 120 disposed in the sense amplifier circuit regions 3a and 3b. The fifth well 120 may be disposed in a first direction like the first well 100, e.g., an x direction, from the sense amplifier circuit region 3a to the sense amplifier circuit region 3b through the conjunction region 4. The fifth well 120 may be disposed in the first direction at a uniform inclination. The first well 120 may have the width w5 that is the same as the width w1 of the first well 100. The fifth well 120 disposed in the sense amplifier circuit regions 3a and 3b may have a different width in a boundary region of the sense amplifier circuits. Meanwhile, although not shown, as described with reference to FIG. 6, a well having different widths may be disposed in the conjunction region 4 to overlap the center of the fifth well 120.

Like in FIG. 10, the second wells 200a and 200b are disposed outside of the conjunction region 4, and the first well 100 and the fifth well 120 are disposed across the conjunction region 4, and thus the sense amplifier circuits formed in a boundary of the sense amplifier circuit regions 3a and 3b and the conjunction region 4 may have the same characteristics as the sense amplifier circuits formed in the sense amplifier circuit regions 3a and 3b.

Figure 12:
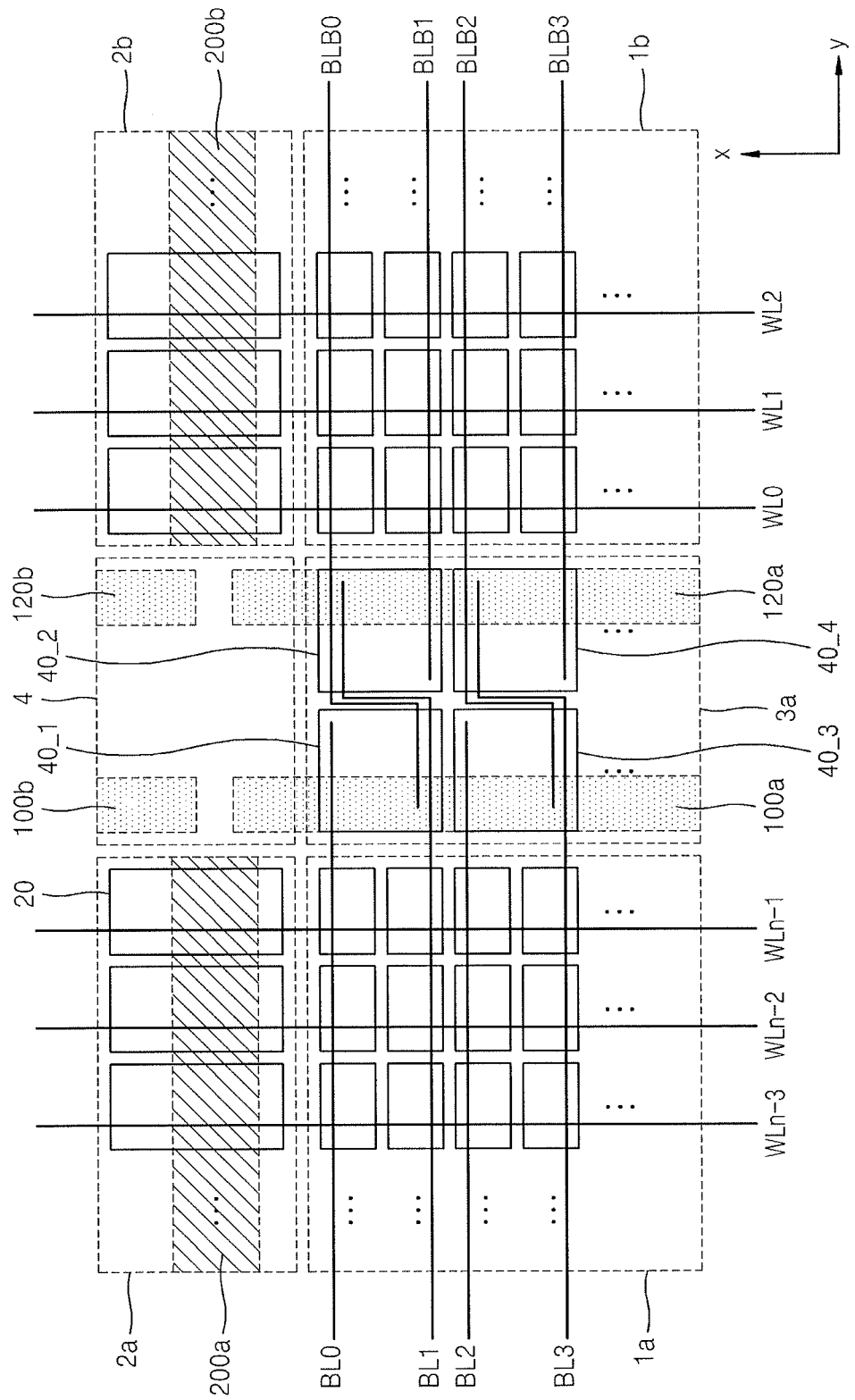
FIG. 12 illustrates a conceptual layout diagram for explaining circuits formed in a memory cell region, a sense amplifier circuit region, and a driving circuit region of a semiconductor memory device to which a layout of wells is applied according to another embodiment of the inventive concept.

FIG. 12 is a conceptual layout diagram for explaining circuits formed in a memory cell region, a sense amplifier circuit region, and a driving circuit region of a semiconductor memory device to which a layout of wells is applied according to another embodiment of the inventive concept. The construction of the semiconductor memory device of FIG. 12 is materially the same as that of the semiconductor memory device of FIG. 7 to which the layout of the wells described with reference to FIG. 2 is applied, except that the layout of the wells described with reference to FIG. 10 is applied to the semiconductor memory device of FIG. 12. Thus, a detailed description thereof will be omitted.

FIGS. 13 and 14 are conceptual layout diagrams for explaining sense amplifier circuits 40_1 and 40_2 formed in the sense amplifier circuit region 3a of FIG. 12. Although the sense amplifier circuits 40_1 and 40_2 are shown in FIGS. 13 and 14, sense amplifier circuits 40_3 and 40_4 may have the same construction and layout as those of the sense amplifier circuits 40_1 and 40_2.

Referring to FIGS. 12 and 13, a P type sense amplifier 42_1, an equalizer 44_1, an N type sense amplifier 46_1, and a column selector 48_1 may be sequentially disposed from the first side y1 to the second side y2 in the sense amplifier circuit 40_1. A column selector 48_2, an N type sense amplifier 46_2, an equalizer 44_2, and a P type sense amplifier 42_2 may be sequentially disposed from the first side y1 to the second side y2 in the sense amplifier circuit 40_2.

The P type sense amplifier 42_1 of the sense amplifier circuit 40_1 may be formed in the first well 100a that is an N type well. The P type sense amplifier 42_2 of the sense amplifier circuit 40_2 may be formed in the fifth well 120a that is the N type well. The equalizers 44_1 and 44_2, the N type sense amplifiers 46_1 and 46_2, and the column selectors 48_1 and 48_2 of the sense amplifier circuits 40_1 and 40_2, respectively, may be formed in a P type substrate that is a region of the sense amplifier circuit region 3a in which the first well 100 and the fifth well 120a are not formed.

Referring to FIGS. 12 and 14, the P type sense amplifier 42_1, the equalizer 44_1, the column selector 48_1, and the N type sense amplifier 46_1 may be sequentially disposed from the first side y1 to the second side y2 in the sense amplifier circuit 40_1. The N type sense amplifier 46_2, the column selector 48_2, the equalizer 44_2, and the P type sense amplifier 42_2 may be sequentially disposed from the first side y1 to the second side y2 in the sense amplifier circuit 40_2.

In the sense amplifier circuits 40_1 and 402 of FIGS. 13 and 14, as described with reference to FIG. 8, the N type sense amplifiers 46_1 and 46_2 and the column selectors 48_1 and 48_2 are spaced apart from the first well 100a and the fifth well 120a in which the P type sense amplifiers 42_1 and 42_2 are formed, by the equalizers 44_1 and 44_2, which may prevent the sensitivity of the sense amplifier circuits 40_1 and 40_2 from deteriorating. Also, in the sense amplifier circuits 40_1 and 40_2 formed in a boundary of the sense amplifier circuit region 3a and the conjunction region 4, continuity of impurity concentration is secured due to the first well 100a and the fifth well 120a extending from the sense amplifier circuit region 3a to the conjunction region 4, which may prevent a threshold voltage of the P type sense amplifiers 42_1 and 42_2 from deteriorating, and the second wells 200a and 200b that are N type wells are not disposed in the conjunction region 4, which may prevent a threshold voltage of the N type sense amplifiers 46_1 and 46_2 and the column selectors 48_1 and 48_2 from deteriorating. That is, the sense amplifier circuits 40_1 and 40_2 may prevent the sensitivity from deteriorating due to the WPE, and a semiconductor memory device including the sense amplifier circuits 40_1 and 40_2 may stably detect data.

While the inventive concept has been particularly shown and described with reference to exemplary embodiments thereof, it will be understood that various changes in form and details may be made therein without departing from the spirit and scope of the following claims.

Example embodiments have been disclosed herein, and although specific terms are employed, they are used and are to be interpreted in a generic and descriptive sense only and not for purpose of limitation. In some instances, as would be apparent to one of ordinary skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the example embodiments as set forth in the following claims.

What is claimed is:

1. A semiconductor memory device, comprising:
a sense amplifier circuit region including first wells disposed in a first direction;
a driving circuit region including second wells disposed in a second direction; and
a conjunction region disposed at an intersection region of the sense amplifier circuit region and the driving circuit region, a part of each of the first wells extending from the sense amplifier circuit region into the conjunction region, and the second wells being only outside of the conjunction region.

2. The semiconductor memory device as claimed in claim 1, wherein the part of each of the first wells in the conjunction region includes first and second partial wells extending from the sense amplifier circuit region at both sides of the conjunction region into the conjunction region, the first and second partial wells being spaced apart from each other.

3. The semiconductor memory device as claimed in claim 2, wherein a length of the first partial well or the second partial well in the first direction is greater than about 5% of a width of the conjunction region in the first direction.

4. The semiconductor memory device as claimed in claim 2, wherein lengths of the first partial well and the second partial well in the first direction are substantially identical to each other.

5. The semiconductor memory device as claimed in claim 2, further comprising a third well in the conjunction region, the third well connecting the first partial well and the second partial well.

6. The semiconductor memory device as claimed in claim 5, wherein a width of the third well is different from widths of the first partial well and the second partial well.

7. The semiconductor memory device as claimed in claim 1, wherein the first wells are disposed across the conjunction region in the first direction.

8. The semiconductor memory device as claimed in claim 7, further comprising a fourth well in the conjunction region, the fourth well overlapping centers of the first wells.

9. The semiconductor memory device as claimed in claim 1, further comprising a sub-word line driving circuit in the driving circuit region.

10. The semiconductor memory device as claimed in claim 1, wherein:
first and second sense amplifier circuits, in which a first sense amplifier, an equalizer, a second sense amplifier, and a column selector are sequentially disposed from the center of the sense amplifier circuit region to an outer side thereof, are in the sense amplifier circuit region, and
the first sense amplifiers of the first and second sense amplifier circuits are in the first wells.

11. The semiconductor memory device as claimed in claim 1, wherein:
first and second sense amplifier circuits, in which a first sense amplifier, an equalizer, a column selector, and a second sense amplifier are sequentially disposed from the center of the sense amplifier circuit region to an outer side thereof, are formed in the sense amplifier circuit region, and
the first sense amplifiers of the first and second sense amplifier circuits are in the first wells.

12. The semiconductor memory device as claimed in claim 1, further comprising a fifth well in the sense amplifier circuit region, the fifth well being spaced apart from the first wells and extending in the first direction, and at least a part of the fifth well is in the conjunction region.

13. The semiconductor memory device as claimed in claim 12, wherein:
first and second sense amplifier circuits in which a column selector, a second sense amplifier, an equalizer, and a first sense amplifier are sequentially disposed from the center of the sense amplifier circuit region to an outer side thereof are formed in the sense amplifier circuit region,
the first sense amplifier of the first sense amplifier circuit is in the first wells, and
the first sense amplifier of the second sense amplifier circuit is in the fifth well.

14. The semiconductor memory device as claimed in claim 12, wherein:
first and second sense amplifier circuits in which a second sense amplifier, a column selector, an equalizer, and a first sense amplifier are sequentially disposed from the center of the sense amplifier circuit region to an outer side thereof are formed in the sense amplifier circuit region, the first sense amplifier of the first sense amplifier circuit is in the first wells, and the first sense amplifier of the second sense amplifier circuit is in the fifth well.

15. A semiconductor memory device, comprising:
a first region including first wells disposed in a first direction and a sense amplifier circuit;
a second region including second wells disposed in a second direction; and
a third region disposed at an intersection region of the first region and the second region, a part of each of the first wells extending from the first region into the third region, and the second wells being only outside of third region.

16. A semiconductor memory device, comprising:
a sense amplifier circuit region including first wells disposed in a first direction;
a driving circuit region including second wells disposed in a second direction other than the first direction; and
a conjunction region disposed at an intersection region of the sense amplifier circuit region and the driving circuit region, wherein the second wells being only outside of the conjunction region.

17. The semiconductor memory device as claimed in claim 16, wherein a part of each of the first wells is disposed in the conjunction region.

18. The semiconductor memory device as claimed in claim 17, wherein each of the first wells extends continuously from a respective sense amplifier circuit region into the conjunction region.

19. The semiconductor memory device as claimed in claim 18, wherein two first wells contact each other at the conjunction region.

20. The semiconductor memory device as claimed in claim 16, wherein a portion of the conjunction region separates the first wells from the second wells along the second direction.

* * * * *